United States Patent

Kennedy et al.

[11] Patent Number: 5,930,693
[45] Date of Patent: Jul. 27, 1999

[54] RADIO RECEIVER WITH UNDERPASS DETECTOR

[75] Inventors: John Francis Kennedy; Robert Donald Plowdrey, both of Dearborn; James Alfred Wargnier, Harrison Township, all of Mich.

[73] Assignee: Ford Motor Company, Dearborn, Mich.

[21] Appl. No.: 08/794,697

[22] Filed: Feb. 3, 1997

[51] Int. Cl.[6] .................................................. H04B 1/06
[52] U.S. Cl. .................... 455/234.1; 455/240.1; 455/241.1; 330/129
[58] Field of Search .................... 455/212, 219, 455/225, 232.1, 234.1, 234.2, 235.1, 239.1, 240.1, 241.1, 250.1, 334, 341; 330/129, 135, 136, 278, 279

[56] References Cited

U.S. PATENT DOCUMENTS

| | | |
|---|---|---|
| 4,574,252 | 3/1986 | Slack . |
| 4,817,192 | 3/1989 | Phillips et al. . |
| 4,829,263 | 5/1989 | Gulczynski ................................ 330/51 |
| 4,893,349 | 1/1990 | Eastmond et al. . |
| 5,077,834 | 12/1991 | Andros et al. ........................ 455/234.1 |
| 5,263,186 | 11/1993 | Gornati et al. ........................ 455/241.1 |
| 5,465,406 | 11/1995 | Whitecar et al. . |
| 5,606,284 | 2/1997 | Tamesue et al. ........................ 330/129 |

*Primary Examiner*—Reinhard J. Eisenzopf
*Assistant Examiner*—Sam Bhattacharya
*Attorney, Agent, or Firm*—Mark Mollon

[57] ABSTRACT

A radio receiver avoids overshoot or undershoot of its audio output caused by inadequate AGC loop response when driving under an underpass and then back into an unobstructed environment. The AGC loop response time is changed upon detection of the sudden decrease in signal level when entering the underpass. The state of the AGC loop prior to entry into the underpass is stored. Upon exiting the underpass, the stored values are restored so that a proper reception level is immediately obtained.

5 Claims, 3 Drawing Sheets

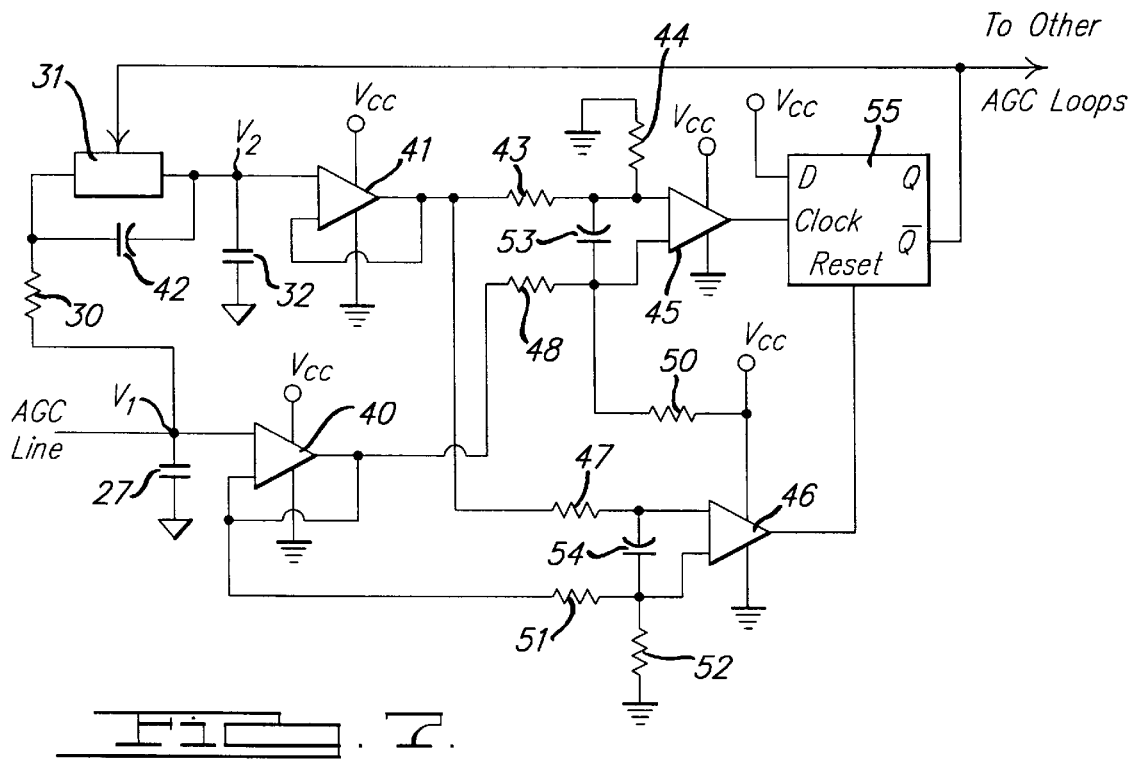
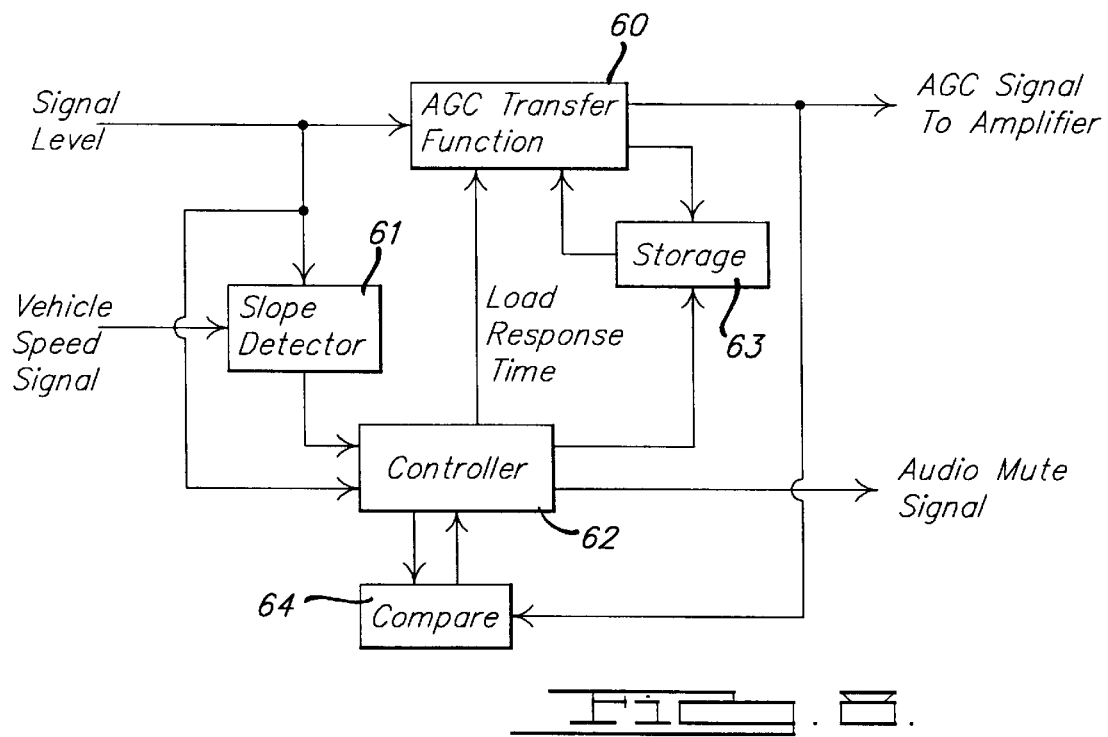

RADIO RECEIVER WITH UNDERPASS DETECTOR

BACKGROUND OF THE INVENTION

The present invention relates in general to automatic gain control (AGC) in a radio receiver, and more specifically to providing automatic gain control with a faster response to rapidly changing signal strength conditions associated with a mobile receiver moving into an underpass.

Automatic gain control (AGC) is a well known technique for maintaining a substantially constant average level of an amplified output signal even though the average input signal level is varying. In broadcast communication receivers, such as an AM receiver, AGC is employed to provide a consistent audio output level despite fluctuations in signal strength of a tuned-in broadcast signal or fluctuations occurring when returning to other broadcast signals of different power levels or distances from the receiver.

An AGC circuit controls the gain of an amplifier stage in inverse proportion to a measured average signal level downstream of the amplifier stage in the receiver. In an AM receiver, the information signal is encoded by amplitude variations in a transmitted carrier signal. In a typical AGC scheme, the AM intermediate frequency (IF) signal is lowpass filtered with a long time constant to remove any audio information signal when determining an AGC control output signal. However, the lowpass filtering results in a long response time of the AGC control circuit to sudden variations in the average signal level.

Sudden variations in signal level may occur when an automotive radio receiver moves from an open environment into a tunnel, into an underpass, or under a viaduct, for example. Although the signal strength of the AM signal may quickly decrease, the AGC control circuit responds to the change only after a delay, resulting in a decreased audio output of the received station and an increased in noise during the delay (known as AGC undershoot). Likewise, when the vehicle reemerges from the tunnel or viaduct and the signal blockage is removed, an over-amplified output is produced (referred to as AGC overshoot).

SUMMARY OF THE INVENTION

It is a primary advantage of the present invention that AGC response time is shortened when entry into an underpass is detected, and AGC loop conditions (including response time) are restored to their previous values as soon as the vehicle reemerges into an open environment.

The invention provides a method of controlling an AGC loop in a radio receiver wherein the AGC loop generates an AGC voltage for controlling a gain applied to a received signal. The AGC voltage changes at a rate determined by an AGC loop response time. In accordance with the method, the received signal is amplified while the AGC voltage is determined by a normal AGC loop response time. The strength of the received signal (e.g., the output of an amplifier amplifying the received signal) is monitored for a sudden decrease in the strength of the received signal. Upon detection of a sudden decrease, the magnitude that the AGC voltage had prior to the sudden decrease is stored and the AGC loop response time is reduced to allow the AGC voltage to change at a faster rate. When the AGC voltage is detected as being greater than a voltage proportional to the stored magnitude, then the receiver has reemerged from the underpass and the stored magnitude of the AGC voltage and the normal AGC loop response time are restored.

BRIEF DESCRIPTION OF THE DRAWINGS

FIG. 7 is a schematic diagram of a first embodiment of the invention using discrete components.

FIG. 8 is a block diagram showing a second implementation of the invention using digital signal processing (DSP).

DETAILED DESCRIPTION OF PREFERRED EMBODIMENTS

Figure 1:
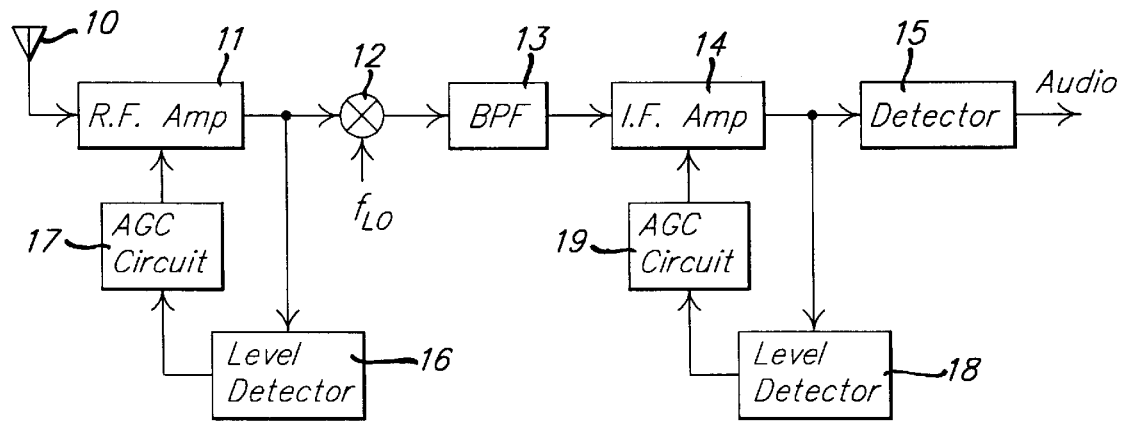
FIG. 1 is a block diagram showing a prior art radio receiver including AGC control circuits for the RF and IF stages.
Figure 2:
FIG. 2 plots amplifier gains versus AGC signal.

In FIG. 1, a conventional receiver includes an antenna 10 connected to a radio frequency (RF) amplifier 11. An RF signal output from RF amplifier 11 is mixed in a mixer 12 with a mixing signal $f_{LO}$ from a local oscillator (not shown). The frequency of mixing signal $f_{LO}$ is selected to frequency shift a desired RF signal output from RF amplifier 11 to the intermediate frequency (IF) of the receiver. The IF signal from mixer 12 is coupled to a bandpass filter (BPF) 13, an IF amplifier 14, and a detector 15 to demodulate the audio signal and thereby produce an audio output. RF amplifier 11 and IF amplifier 14 provide controllable gains in response to AGC signals from respective AGC control circuits 17 and 19. A level detector 16 is connected to the output of amplifier 11 to provide an RF level signal to AGC circuit 17 corresponding to the level of the RF output. Similarly, a level detector 18 provides an IF level signal to AGC circuit 19 according to the IF output. AGC circuits 17 and 19 respond to the level signals to produce respective AGC curves of the type shown in FIG. 2 in order to control amplifier gain to provide a consistent average amplifier output. Thus, as a signal level rises, the AGC signal rises in voltage up to a maximum thereby reducing amplifier gain. As amplified level drops, the AGC signal level drops resulting in an increased amplifier gain.

The AGC control scheme must not respond too quickly to amplitude changes in the amplifier output. Specifically, the AGC circuit should not respond to signal variation within the audio frequency range, otherwise the audio modulation would be removed from the signal and no audio would be detected. Thus, the AGC circuit is active at frequencies below the audio range (less than about 40 Hertz) and is not responsive to amplitude changes occurring above the lower end of the audio frequency range.

Figure 3:
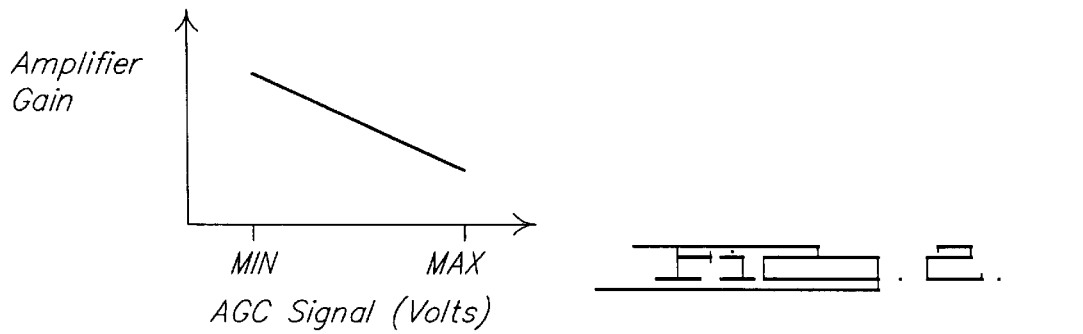
FIG. 3 plots the response of an AGC signal to a sudden decrease in signal level.

Consequently, the response time of prior art AGC circuits causes undershoot and overshoot associated with entering and leaving an underpass, for example. As shown in FIG. 3, dashed line 20 shows the strength of a received signal as the mobile receiver enters an underpass at time $t_1$. The signal strength quickly drops to a low value and remains at a low value while the vehicle progresses through the underpass. Line 21 shows the response of the AGC loop as it changes the amplifier gain to a new value appropriate to the new signal condition. The AGC loop begins to adjust at $t_1$ but does not reach 100% of its adjustment to the new amplifier gain until time $t_2$. The time between $t_1$ and $t_2$ corresponds to under-amplification of the desired signal and an excess of noise in the audio output. Likewise, when the vehicle reemerges from the underpass, a sudden increase in signal strength will result in over-amplification of a desired signal during the time delay.

Figure 4:
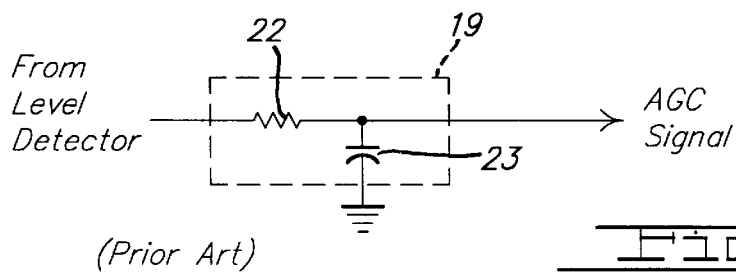
FIG. 4 is a schematic diagram showing a simplified AGC circuit of the prior art.

FIG. 4 shows a portion of a typical AGC circuit 19 including a series resistor 22 and a parallel capacitor 23 resulting in a lowpass filter function of the AGC circuit.

Figure 5:
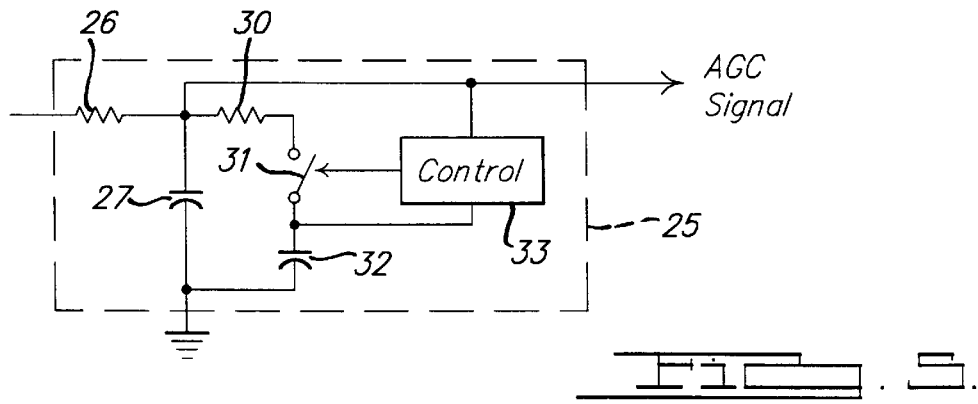
FIG. 5 is a schematic diagram showing modifications to an AGC circuit used in the present invention.

FIG. 5 shows an improved AGC circuit 25 according to the present invention. AGC circuit 25 can be switched between a fast loop response time and a normal loop response time by means of a switched capacitor. An input from a level detector is coupled to a resistor 26 in AGC circuit 25. The AGC output signal is generated at the remaining side of. resistor 26. A first capacitor 27 is connected between resistor 26 and ground. Across capacitor 27 is connected the series combination of a resistor 30, a controllable switch 31, and a second capacitor 32. A control circuit 33 has inputs connected to sense the voltages across capacitors 27 and 32 and has an output for controlling switch 31. Switch 31 preferably takes the form of a transistor.

In operation, switch 31 is normally closed in order to provide a normal AGC loop response time. The larger the capacitance in the AGC circuit, the slower the response time. With capacitors 27 and 32 connected in parallel, their capacitances add to create the desired normal response time. However, the capacitance of capacitor 27 is selected to be lower than the capacitance of capacitor 32 (e.g., capacitor 27 may have a value of 1 microFarad while capacitor 32 has a value of 10 microFarads). Since the non-grounded sides of capacitor 27 and 32 are separated by a resistor 30, their respective voltages are different during transient inputs, and the voltage across smaller capacitor 27 responds faster to the transients. A sudden decrease in the voltage from capacitor 27 with respect to the voltage from capacitor 32 is sensed by control 33 and switch 31 is opened to remove capacitor 32 from the active circuit. The remaining capacitance of capacitor 27 is lower and provides a faster AGC loop response time so that the receiver quickly responds to the lower signal level as the receiver enters an underpass. With capacitor 32 isolated, the voltage of the AGC signal prior to entering the underpass is stored automatically. Control 33 then waits until the AGC signal voltage across capacitor 27 again rises to the level stored on capacitor 32 (i.e., the vehicle has reemerged from the underpass and the signal strength has recovered to its earlier value). Then control 33 closes switch 31 restoring capacitor 32 and its voltage into the circuit. The voltage of the AGC signal is then substantially clamped to the voltage stored on capacitor 32 because of its greater capacitance than the capacitance of capacitor 27.

Figure 6:
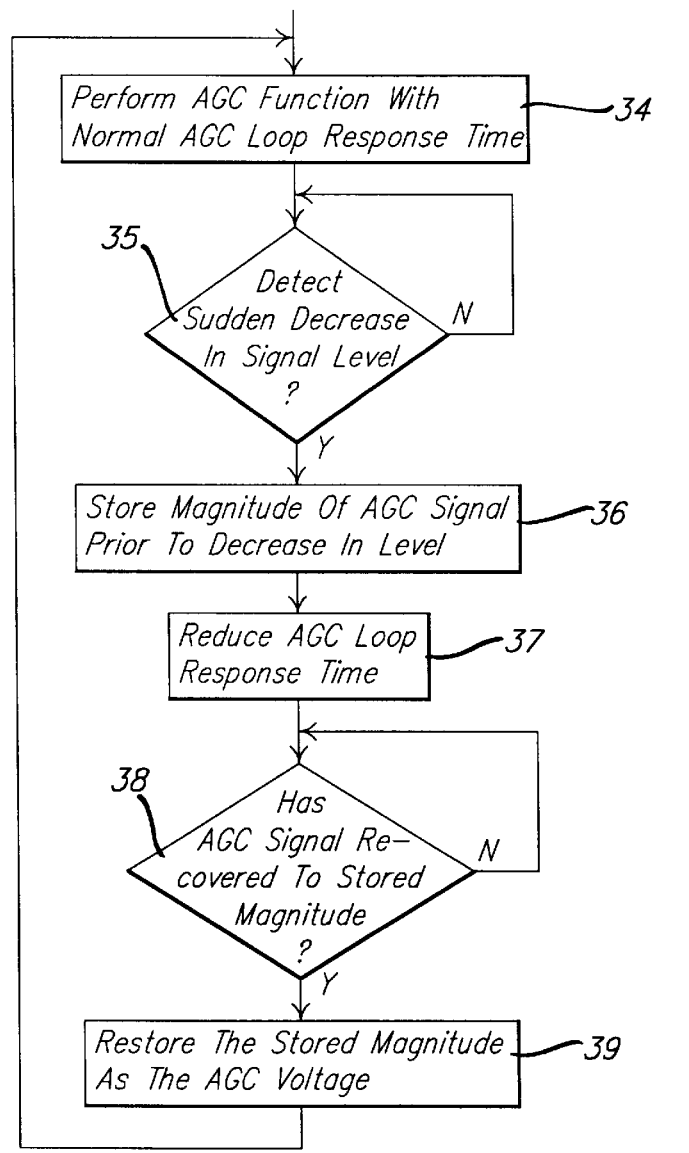
FIG. 6 is a flowchart illustrating a preferred method of the present invention.

The operation of the invention is summarized in the flowchart of FIG. 6. In step 34, the receiver initially performs the AGC function with a normal AGC loop response time. In step 35, a check is made to determine whether a sudden decrease in signal level is seen. If not, then use of the normal loop response time continues and further checks are made for a sudden decrease. When a sudden decrease is seen, the magnitude of the AGC signal prior to the decrease is stored in step 36, the AGC loop response time is reduced in step 37. Then, continuous checks are made in step 38 to determine whether the AGC signal has recovered to the stored magnitude (or a proportion of the stored magnitude). When it has recovered, the stored magnitude is restored as the AGC voltage in step 39 and a return is made to step 34 for performing the AGC function with the normal AGC loop response time.

A more detailed embodiment of the invention using discrete analog components is shown in FIG. 7. The AGC voltage, designated $v_1$ across capacitor 27, is coupled to resistor 30 and to one input of a buffer amplifier 40. A voltage $v_2$ across capacitor 32 is coupled to one input of a buffer amplifier 41 and to one end of controller switch 31. A capacitor 42 is connected across switch 31 to reduce high frequency noise that could lead to oscillation in the circuit.

Voltage $v_2$ is coupled through buffer amplifier 41 to a voltage divider comprised of a resistor 43 and a resistor 44. The junction of resistor 43 and 44 are connected to one input of a comparator 45. The output of buffer amplifier 41 is also coupled to an input on a comparator 46 through a coupling resistor 47.

The output of buffer amplifier 40 provides voltage $v_1$ to the second input of comparator 45 through a resistor 48. The second input of comparator 45 is coupled to a positive supply voltage $V_{CC}$ through a resistor 50. The output of buffer amplifier 40 is also connected to a voltage divider comprised of resistors 51 and 52. The junction of resistors 51 and 52 is connected to the second input of comparator 46. Comparators 45 and 46 have high frequency shorting capacitors 53 and 54 connected across their inputs respectively.

The output of comparator 45 is connected to the clock input of a flip flop 55. The output of comparator 46 is connected to the reset input of flip flop 55. The D input of flip flop 55 is connected to positive supply voltage $V_{CC}$, and the Q NOT output from flip flop 55 is connected to the control input of switch 31 and to other AGC loops which may be simultaneously controlled. Thus, when there are multiple AGC loops in a receiver, they may all be controlled by one control circuit. Preferably, the fastest operating AGC loop is selected to house the control circuit and will typically be the IF AGC loop.

Under study state conditions, switch 31 is closed and $v_1=v_2$. When the receiver enters an underpass, the signal level drops sharply and the amplitude of $v_1$ falls with respect to $v_2$. Comparator 45 has one input value slightly below $v_2$ by virtue of the voltage divider including resistors 43 and 44 and has a second input value slightly above $v_1$ by virtue of the voltage divider including resistors 48 and 50 which are connected to the positive supply voltage. These voltage offsets prevent oscillation of the detector and insure that only a sudden decrease in signal level is detected. When the voltage at the junction of resistors 43 and 44 rises above the voltage at the junction of resistors 48 and 50 due to the sudden decrease, comparator 45 switches to a high output causing a positive transition at the clock input of flip flop 55. Since the D input is tied to a high voltage, the flip flop switches to a low output at its Q NOT output, thereby opening switch 31.

With switch 31 opened, voltage $v_2$ on capacitor 32 is isolated and is stored as the previous AGC voltage (subject to leakage from the capacitor over time). The isolated voltage is used as a reference point in comparator 46 to determine the end of the signal obstruction from the underpass. A proportion of voltage $v_2$ is coupled through resistor 47 to comparator 46. Since voltage $v_1$ has dropped, the further divided voltage at the junction of resistors 51 and 52 is initially lower than the voltage from resistor 47. Thus, comparator 46 does not switch until voltage $v_1$ rises so that its divided value exceeds the voltage from resistor 47. At that point, a positive voltage transition appears at the output of comparator 46 to reset flip flop 55 and to cause a high signal at the Q NOT output. Then switch 31 closes and restores capacitor 32 to the AGC circuit. Reestablishing the pre-viaduct AGC voltage prevents the overshoot effects described above.

The embodiment of FIG. 7 works well in most situations. However, the stored capacitor voltage may be lost by leakage while in a long tunnel or when moving under an underpass at a very slow speed, such as in a traffic jam. A further improvement can be realized in a digital receiver such as one implemented using digital signal processing (DSP). In an embodiment of the invention using a DSP receiver, the entire state of the AGC loop is stored in memory when a viaduct is detected. The stored AGC loop parameters do not degrade over time and can be restored after any duration of signal blockage by an underpass.

FIG. 8 shows a portion of a DSP receiver wherein a digital signal level is input to an AGC transfer function 60 to provide a digital AGC signal to an amplifier (i.e. multiplier). The function may be used at either an IF section or an RF section of the receiver. The level signal is also input to a slope detector 61 to detect when a large negative rate of change in the level exists, as would occur during entry into an underpass. When an underpass is detected, controller 62 receives a signal from slope detector 61 and causes current AGC parameter values to be transferred from transfer function 60 to storage 63. Controller 62 also causes a faster response time parameter value to be loaded into transfer function 60 and causes the pre-decrease AGC signal to be loaded into a compare block 64. Subsequently, compare block 64 compares the stored AGC signal with the current AGC signal and sends a signal to controller 62 when the current signal again reaches the stored value. Then, controller 62 causes storage 63 to restore the pre-viaduct parameter values to AGC transfer function 60.

Thus, undershoot and overshoot of the audio output are avoided during sudden transients caused by driving under an obstruction.

Since the suddenness of the degradation in signal strength caused by driving into an underpass depends upon the speed at which the vehicle enters, slope detector 61 utilizes a speed signal to determine a threshold slope for triggering the detection. The speed signal can be obtained from an engine control unit in the vehicle and may be comprised of actual vehicle speed or an engine RPM to estimate vehicle speed. In any case, the greater the speed signal, the greater will be the slope that is used as a threshold slope by slope detector 61. As a result, the entry into an underpass is detected with greater accuracy.

Controller 62 outputs a mute signal in order to mute the audio output of the receiver under certain conditions. Specifically, when an underpass condition is detected then it can be expected that if the received signal level drops below a predetermined level then the signal-to-noise ratio of the output audio signal will be too low to provide listenable performance. Therefore, the signal level is compared to the predetermined level by controller 62 and the mute signal is generated accordingly. Preferably, the muting and restoring of the audio takes place gradually to avoid sudden changes in loudness.

What is claimed is:

1. A method of controlling an AGC loop in a radio receiver, said AGC loop generating an AGC voltage for controlling a gain applied to a received signal, said AGC voltage changing at a rate determined by an AGC loop response time, said method comprising the steps of:
    amplifying said received signal with said AGC voltage being determined by a normal AGC loop response time;
    detecting a sudden decrease in strength of said received signal;
    storing a magnitude that said AGC voltage had prior to said sudden decrease;
    reducing said AGC loop response time to allow said AGC voltage to change at a faster rate;
    detecting when said AGC voltage is greater than a voltage proportional to said stored magnitude; and
    restoring said stored magnitude as said AGC voltage and restoring said normal AGC loop response time.

2. The method of claim 1 wherein said AGC loop response time is determined by a capacitance in an AGC circuit, wherein said step of reducing said AGC loop response time is comprised of removing a portion of said capacitance from said AGC circuit and wherein said step of restoring said normal AGC loop response time is comprised of reinserting said portion of said capacitance.

3. The method of claim 1 wherein said AGC loop is comprised of an AGC transfer function having parameters included in a digital signal processor, wherein said parameters are controlled to reduce said AGC loop response time.

4. A radio receiver comprising:
    an amplifier amplifying an input signal to produce an output signal, said amplifier having a gain control input;
    a level detector generating a level signal proportional to a level of said output signal; and
    an AGC circuit responsive to said level signal to provide an AGC signal to said gain control input, said AGC circuit normally responding to changes in said level signal with a normal response time, and responding to changes in said level signal with a fast response time following a sudden decrease in said level signal, said AGC circuit including a storage device storing a signal magnitude substantially equal to said level signal prior to said sudden decrease, wherein said normal response time is restored when said level signal subsequently increases to be substantially equal to said stored signal.

5. The receiver of claim 4 wherein said AGC circuit includes a slope detector responsive to said level signal for detecting said sudden decrease when said level signal decreases with a slope greater than a predetermined slope.

* * * * *